United States Patent
Kamisawa

[19]
[11] Patent Number: 6,013,334
[45] Date of Patent: *Jan. 11, 2000

[54] METHOD FOR FORMING A THIN FILM OF A COMPLEX COMPOUND

[75] Inventor: Akira Kamisawa, Ukyo-ku, Japan

[73] Assignee: Rohm Co. Ltd., Kyoto, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/979,214

[22] Filed: Nov. 26, 1997

Related U.S. Application Data

[63] Continuation of application No. 08/551,568, Nov. 1, 1995, abandoned, which is a continuation-in-part of application No. 08/249,528, May 26, 1994, abandoned.

[30] Foreign Application Priority Data

May 27, 1993 [JP] Japan ................................ 5-125654

[51] Int. Cl.$^7$ ................................ B05D 3/06; B05D 3/02
[52] U.S. Cl. .................... 427/551; 427/553; 427/554; 427/557; 427/558; 427/226; 427/126.3
[58] Field of Search ..................................... 427/551, 553, 427/554, 226, 126.3, 557, 558

[56] References Cited

FOREIGN PATENT DOCUMENTS 64-126 1/1989 Japan .
5-116454 5/1993 Japan .

OTHER PUBLICATIONS

Nakao et al, Jpn. J. Appl. Phys. vol. 32, Part I, No. 9B, Sep. 1993, pp. 4141–4143.

*Primary Examiner*—Roy V. King
*Attorney, Agent, or Firm*—Merchant & Gould P.C.

[57] ABSTRACT

The present invention provides a method for forming a thicker thin film of complex compound easily without causing cracks in the film. Sol solution is coated and dehydrated on an upper surface of a substrate by sol-gel method (step S1, S2). A thin film formed on the upper surface of the substrate is exposed by radiation which has predetermined energy (step S3). Thus, the thin film of complex compound is polymerized, cracks are not caused even in forming a thicker thin film.

14 Claims, 8 Drawing Sheets

METHOD FOR FORMING A THIN FILM OF A COMPLEX COMPOUND

CROSS REFERENCES TO RELATED APPLICATIONS

This application is a continuation of application Ser. No. 08/551,568 filed on Nov. 1, 1995, now abandoned, which is a continuation-in-part of application Ser. No. 08/249,528, filed on May 26, 1994.

BACKGROUND OF THE INVENTION

1. Field of the Invention

The present invention relates to a method for forming a thin film of oxide complex compound (complex compound, hereinafter referred as complex compound), more specifically, a method for forming complex compound layer by utilizing sol-gel method.

2. Description of the Prior Art

In general, vacuum deposition methods or sputtering methods are commonly used for forming a functional film (layer) which is applied for electric devices. However, these method have difficulty in controlling the formation of the layer and reproducibility at ferroelectric layer of multi-ingredients, superconducting layer and conducting layer. Also, similar difficulty is observed when forming the layer under low temperature condition as well as forming the layer to large area.

Recently, to resolve above issues, a sol-gel method is often used as one technique for forming a thin film of complex compound.

FIG. 1 shows a typical steps of forming a thin film of complex compound under sol-gel method of the prior art. With the sol-gel method, the thin film is formed on a substrate of a semiconductor device through following three steps such as coating sol solution on the substrate, dehydration of the sol solution and baking the sol solution on the substrate. Initially, adequate quantity of water is added to composite alkoxide (for instance, PZT (Pb (lead), Zr(zirconium) and Ti(titanium)) to cause hydrolysis and polycondensation as shown in step "a" of FIG. 1. Thus, sol solution is prepared as shown in "b" of FIG. 1. The sol solution is coated on the substrate of a semiconductor device to obtain a layer of polymer gel state by dipping coat method or spin coat method (see step "c" of FIG. 1). Dipping coat method is a method for obtaining the layer on the substrate, that is the substrate is dipped into the sol solution thoroughly, then the substrate is pulled out from the sol solution in constant speed. On the other hand, the spin coat method is a method for obtaining uniform layer on the substrate, that is the solution is dropped onto the substrate, then the substrate is rotated at a high speed.

The layer is dehydrated on a hot plate at 100° C. to 450° C. (see step "d" of FIG. 1), then the layer is baked at 650° C. These processes forms a PZT oxide thin film as shown in step "e" of FIG. 1. Thus, a thin film of complex compound is formed on a surface of the substrate of a semiconductor device.

However, above described method for forming a thin film of complex compound has following problems.

In the sol-gel method, to obtain a layer which has thickness over 100 nanometers (nm), some cracks are caused as shown in FIG. 2 from shrinkage of the layer at thermal treatment (dehydration, baking) process. Therefore, the thickness of the layer is limited to nearly 20 to 100 nm, which can be formed in single thermal treatment such as coating the sol solution, dehydration of the solution, dehydration and baking, due to shrinkage of the thin film during the thermal treatment.

From this fact, repeated thermal treatments such as coating, dehydration, baking process are necessary to achieve reliable insulation.

SUMMARY OF THE INVENTION

It is an object of the present invention to provide a method forming a thin film of complex compound which can be formed easily without causing the cracks.

A method for forming a thin film of complex compound on an upper surface of a substrate for semiconductor device by utilizing sol-gel method, comprises following steps of:

a step for exposing the thin film to radiation which has predetermined energy; and a step for baking the thin film after the step for exposing the thin film.

A thin film of complex compound formed on an upper surface of a substrate for semiconductor device by utilizing sol-gel method, comprising following steps:

a step for baking the thin film after a step for exposing the thin film to the radiation which has predetermined energy.

A method for forming a thin film of complex compound formed on an upper surface of a substrate for a semiconductor device by utilizing the sol-gel method, comprising following steps:

a step for polymerizing the thin film; and a step for baking the layer after the step of polymerizing.

While the novel features of the invention are set forth in a general fashion, particularly in the appended claims, the invention, both as to organization and content, will be better understood are appreciated, along with other objects and features thereof, from the following detailed description taken in conjunction with the drawings.

DESCRIPTION OF THE PREFERRED EMBODIMENT

Figure 1:
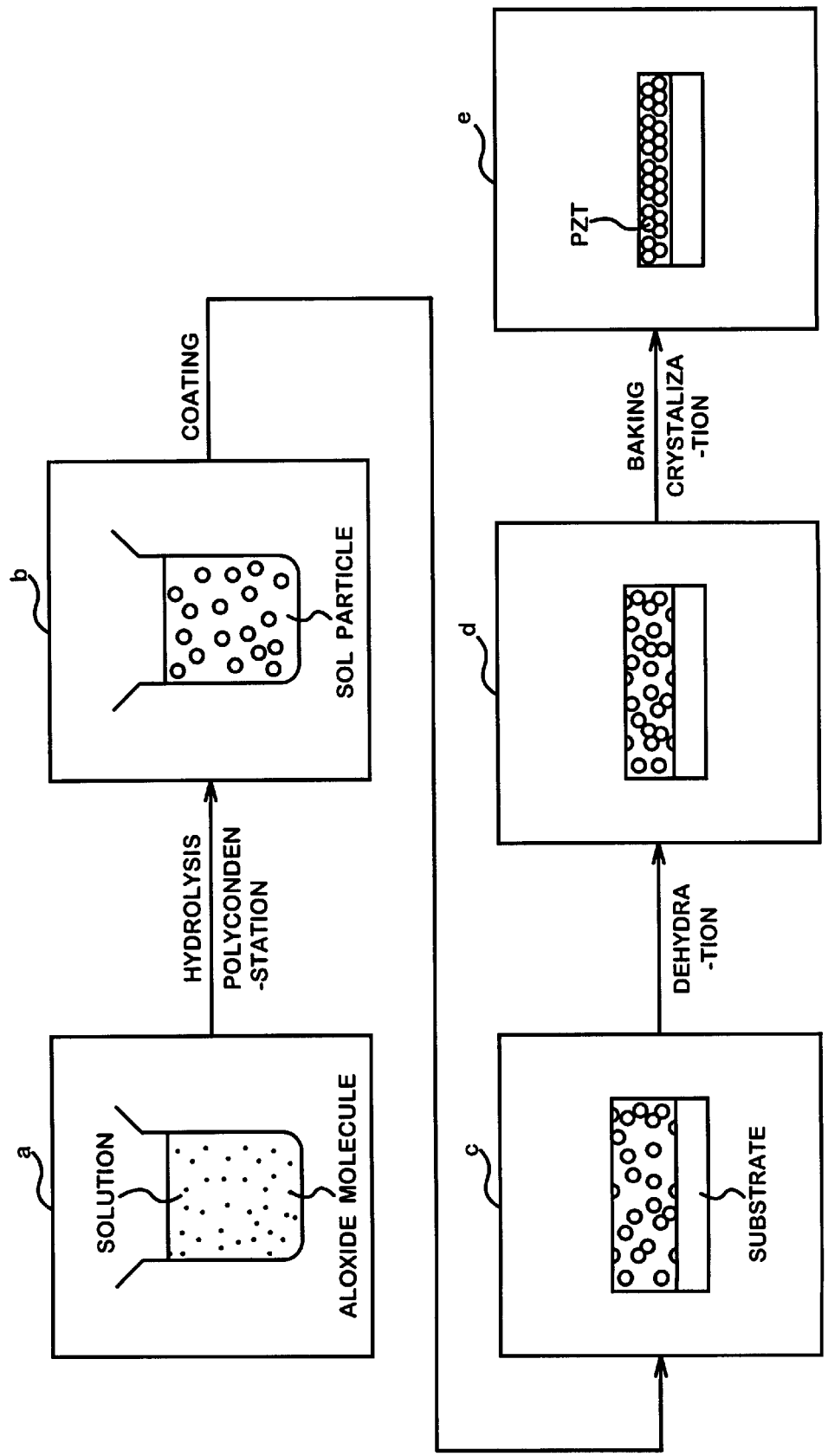
FIG. 1 is a typical process of forming a thin film of complex compound in the prior art.
Figure 2:
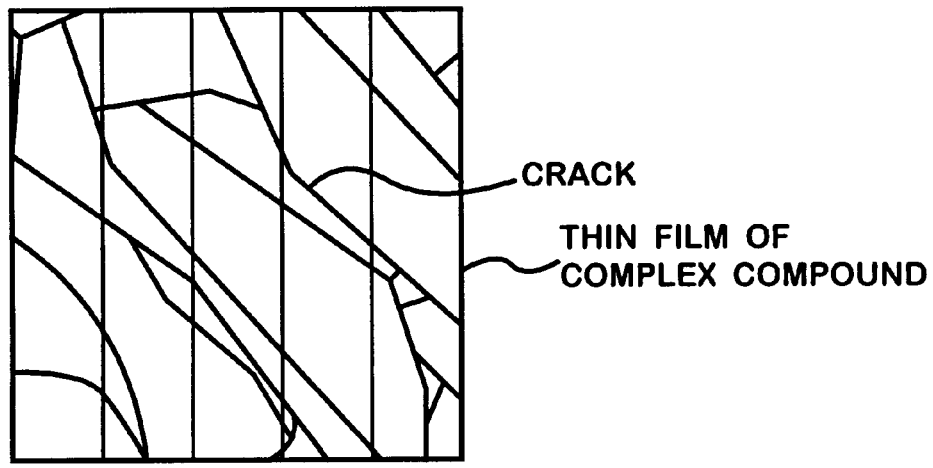
FIG. 2 is a view illustrating cracks in the layer.
Figure 3:
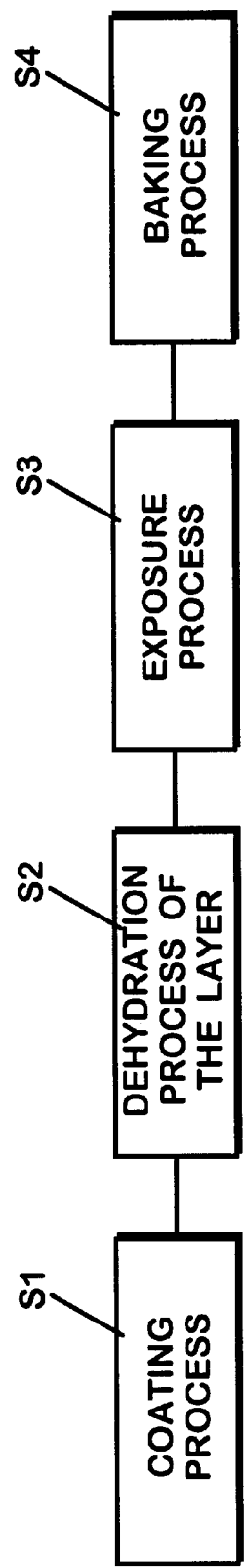
FIG. 3 is a view illustrating process steps of a method for forming a thin film of complex compound in the present invention.

An embodiment of a method for forming a thin film of complex compound in the present invention will be described with FIG. 3. Initially, the sol solution is coated on the upper surface of a substrate of a semiconductor device at coating process (S1). Then, the sol solution which is contained in the layer is dehydrated by a dehydration process (S2). Also, in order to accelerate hydrolysis of the layer and polycondensation of the layer, the dehydrated layer is exposed to radiation which has a predetermined energy in the exposure process (S3). After exposure process, a thin film of complex compound is formed through baking the exposed layer under predetermined temperature at the baking process (S4).

Figure 4:
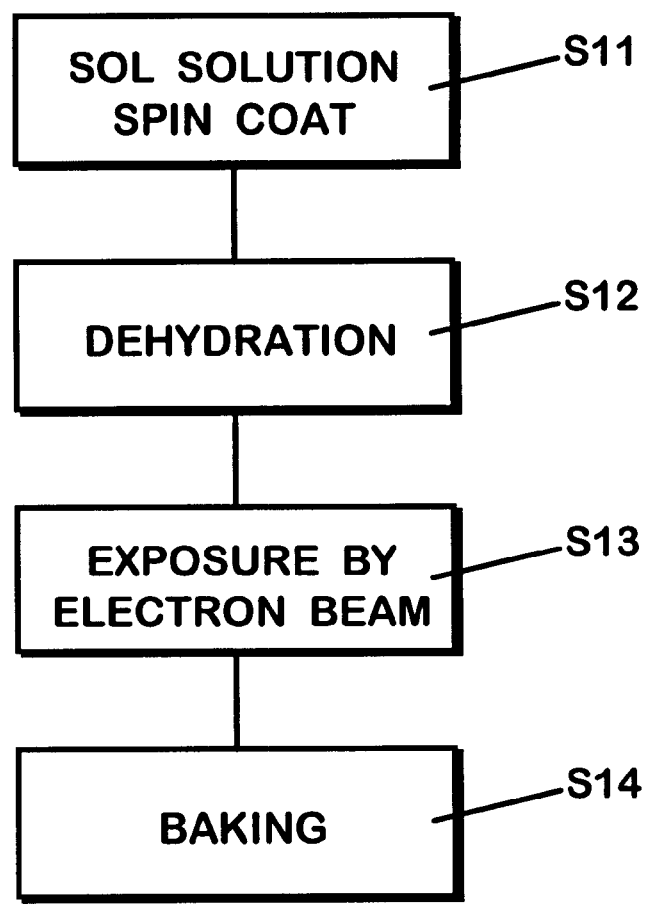
FIG. 4 is a view illustrating process steps of a method for forming a ferroelectric thin film in the present invention.

FIG. 4 shows process steps for a method for forming a ferroelectric thin film in the present invention. In this embodiment, the ferroelectric thin film which utilized for manufacturing ferroelectric memory such as FRAM, MFSFET, is formed at predetermined location on a silicon substrate. The silicon substrate is fabricated by forming a heat oxidation layer of 600 nm thickness on a substrate, then titanium layer of 50 nm thickness and platinum layer of 200 nm are formed on the heat oxidation layer by RF magnetron sputtering method as a lower electrode.

Following steps are carried out to form the thin film. First, sol solution is prepared. Lead acetate trihydrate (Pb $(CH_3COO)_2 \cdot 3H_2O$) is liquefied into 2-methoxy ethanol at 70° C. in condition of the mol ratio of Lead acetate trihydrate and 2-methoxy ethanol is 1 to 5, then dehydration is carried out by boiling the solution until 120° C. Upon the solution is cooled down to 90° C., predetermined quantity of zirconate tetra-n-butoxide and titanium tetra isopropoxide are added to the solution with stirring so that the mol ratio of $PbTiO_3$ and $PbZrO_3$ is 47 to 53. To eliminate a by-product, this solution is boiled until it reaches 125° C. Moreover, 2-methoxy ethanol is added to the solution so that concentration of PZT sol solution becomes to 0.5 mol/l. Distilled water which has twice as much molarity than the solution is added to the solution so as to carry out partial hydrolysis. PZT solution (the mol ratio of PB, Zr and Ti are 1.05, 0.52 to 0.48) is utilized as the coating liquid. Also, acetylacetone which acted as a solution stabilizer can be added to 2-methoxy ethanol.

In this embodiment, the PZT solution is coated uniformly on a predetermined part of the substrate by a spin coat method. In the spin coat method, the PZT solution is coated on the substrate under following condition 500 rpm for 5 second, 3,000 rpm for 20 second (S11). The substrate is placed into a clean oven and heated up for 15 minutes (S12).

Next, exposure process is carried out. At exposure process, electron beam, with radiation which has predetermined energy such as a value ranging from 1 $\mu C/cm^2$ to 4000 $\mu C/cm^2$ is exposed to whole surface of the thin film formed on the substrate (S13).

The thin film which is exposed by the electron beam is heated at 400° C. for 30 minutes in an oxygen atmosphere to eliminate organic matter which remains in the thin film. The film is baked at 700° C. for 60 minutes in the oxygen atmosphere and receives final thermal treatment by RTP (Rapid Thermal Processor) (S14).

Figure 5:
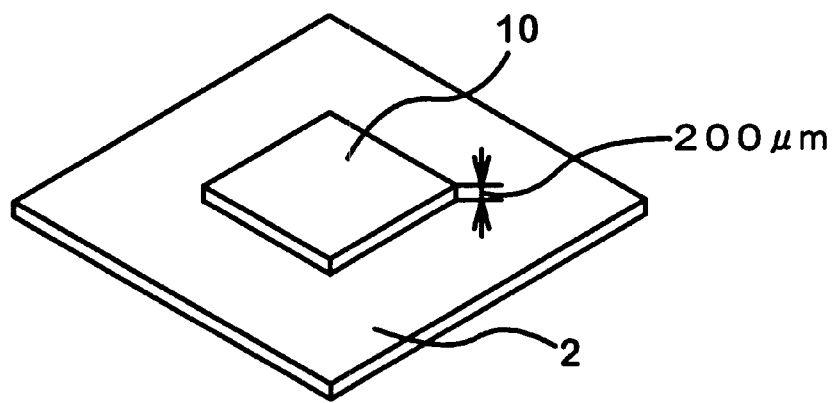
FIG. 5 is a view illustrating a ferroelectric thin film formed with the method showing in FIG. 4 on a silicon substrate.

FIG. 5 illustrates ferroelectric thin film 10 formed on silicon substrate 2 by above described processes. As it is clear from FIG. 5, no crack is observed in the thin film. Beside that, thickness of the film keeps 200 nm from single sequential processes of coating, dehydration, exposure and baking. Polymerization of the thin film is caused by bridging (hydrolysis polycondensation), with exposing the thin film to the electron beam. It is believed that as a result of carrying out the exposure step prior to baking, no cracking is caused in the film during the baking process, even when forming the thin film in thickness of 200 nm.

These method for forming a thin film of complex compound make possible to form a ferroelectric thin film with a thickness over 100 nm through single sequential processes of spin coat, dehydration, and baking while preventing cracking in the thin film.

Figure 6:
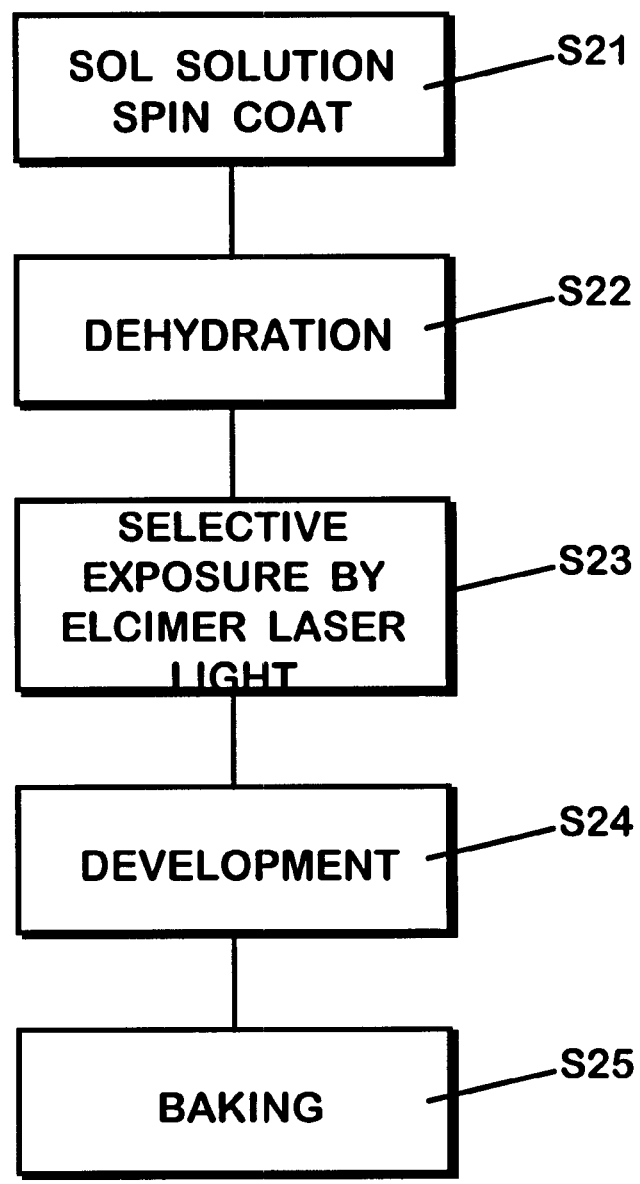
FIG. 6 is a view illustrating process steps of a method forming a patterning of the ferroelectric thin film.

FIG. 6 shows a method for forming a patterning of ferroelectric thin film in the present invention. In this embodiment, the same silicon substrate and PZT solution is utilized as in the above disclosed embodiment.

The PZT solution is coated on the substrate by the spin coat method as described in above (S21). The thin film formed on the substrate is dehydrated at 90° C. for 10 minutes in a clean oven (S22).

Figure 7:
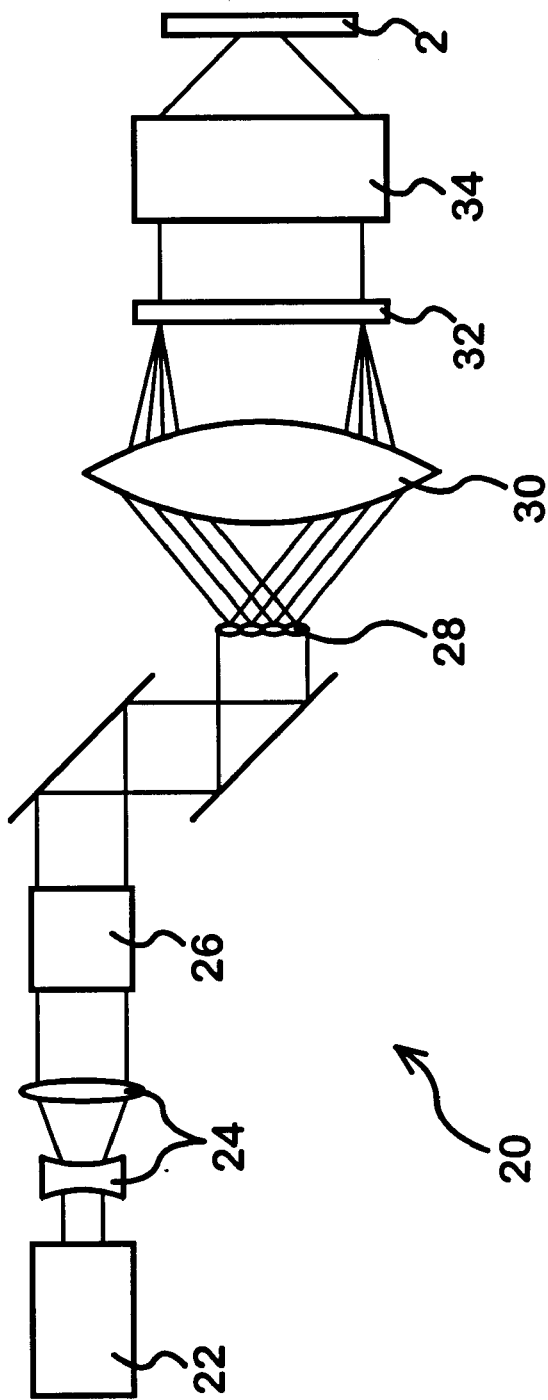
FIG. 7 is a view illustrating excimer laser stepper utilized in the present invention.

Upon completion of dehydration, the ferroelectric thin film is exposed selectively to excimer laser as radiation. FIG. 7 shows an structure of excimer laser stepper 20 (NIKON NSR-2005EX8A).

The excimer laser stepper 20 comprises a light emitter 22, cylindrical lens 26, zoom lens 26, fly eye lens 28, condenser lens 30, reticle 32 and projection lens 34.

KrF excimer laser light of wavelength 249 nm is emitted from the light emitter 22. A circuit pattern which has to be formed on the silicon substrate 2 is drawn on the reticle 32. The fly eye lens 28 equalize energy of the excimer laser light, and the laser light is focused on the reticle 32 with condenser lens 30. The silicon substrate 2 is exposed repeatedly to the laser light which gradually increases its energy along with the circuit pattern of the reticle 32 through the projection lens 34. The energy range of the KrF excimer laser light is applicable in any range from 0.1 $J/cm^2$ to 25 $J/cm^2$.

It is also believed that part of the ferroelectric thin film that was exposed by the laser light caused hydrolysis and polycondensation reaction when polymerized. On the other hand, unexposed part of the thin film by the laser light does not cause polymerization. That is, emission of KrF excimer laser light to the thin film makes differences in solubility of the thin film during the development process.

Therefore, the part of the thin film where is exposed with KrF excimer laser light becomes insoluble in pure water, so that a negative type circuit pattern is formed by development of pure water (S24). Then, developed pattern of the thin film is baked as disclosed in the previous embodiment (S25).

Figure 8:
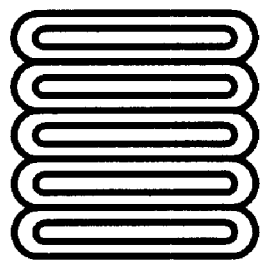
FIG. 8 is a partial enlarged view illustrating a pattern of the ferroeolectric thin film.
Figure 8:
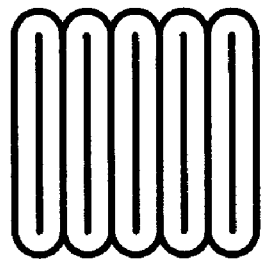
Figure 8:
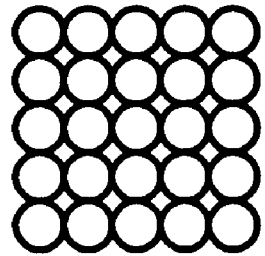
Figure 8:
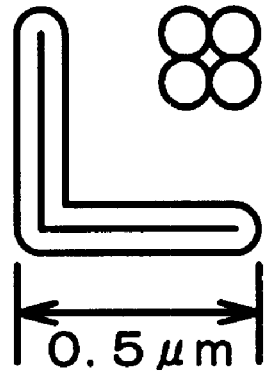

Thus, very fine patterning of a ferroelectric thin film can be formed where the film has been exposed by the excimer laser light. FIG. 8 shows a partial enlarged view of the ferroeolectric thin film. As shown in the FIG. 8, utilizing the above disclosed method, a very fine finish of etching having a line width 0.5 to 0.6 micron meter is obtainable.

Although the disclosed embodiments, electron beam or excimer laser light is utilized as radiation, X-ray, far-ultraviolet or ion beam can be used for radiation.

Also, the method for forming a thin film is applied to form a thin film of complex compound, the method can be applied to form either ITO (indium tin oxide) and zirconium oxide ($ZrO_2$).

A ferroelectric thin film formed by the method for forming a thin film of complex compound in the present invention can be applied to various kind of sensors such as light, temperature, humidity, and acceleration of gravity.

Although the disclosed embodiments uses PZT solution as sol solution, other solution is substitutable for the ferroelectric sol solution such as $PbTiO_3$ (barium titanate), bismuth titanate or PLZT.

A method for forming a thin film of complex compound in the present invention, to form the thin film on an upper surface of the substrate, sol solution is coated with sol-gel and the solution is dehydrated. After dehydration, radiation which has predetermined energy is exposed to all over the thin film thus formed so as to form the thin film of complex compound having thickness more than 100 nm. Therefore, much thicker film of complex compound can be formed without cracks in comparison with a thin film which is formed in the prior art, due to the thin film of complex compound in the present invention being polymerized.

In the method for forming a pattern of a thin film of complex compound in the present invention, the thin film, which is formed on the upper surface of the substrate, through coating sol solution by sol-gel method and dehydrating the solution, is selectively exposed to radiation which has a predetermined energy. Then, the thin film, which has been selectively exposed, is developed. Therefore, a fine etching finish can be obtained because of differentiation of solubility in the reaction ratio of hydrolysis polycondensation between an exposed part and an unexposed part of a thin film of complex compound by radiation during the development process.

Although the invention has been described in its preferred form with a certain degree of particularly, it is understood that the present disclosure of the preferred form has been combination and arrangement of parts may be resorted to without departing from the spirit and the scope of the invention as hereinafter claimed.

What is claimed is:

1. A method for forming a thin film of a complex compound on an upper surface of a substrate for a semiconductor device, comprising:

coating a sol-gel solution on the substrate to form a thin film on the substrate;

exposing the surface of the thin film to radiation in order to promote hydrolysis polycondensation in the thin film; and baking the thin film exposed to radiation in order to form the thin film of the complex compound on the upper surface of the substrate;

wherein the sol-gel solution is coated on the substrate in a thickness sufficient to form, in a single process including the coating, exposing and baking steps, the thin film of the complex compound in a thickness greater than a maximum thickness in which a thin film of complex compound is formed without cracking by a process including coating and baking steps without an intermediate irradiation step.

2. The method of claim 1, further comprising: dehydrating the thin film, prior to the step of exposing the thin film to radiation.

3. The method of claim 1, wherein the radiation is electron beam.

4. The method of claim 1, wherein the radiation is excimer laser light.

5. The method of claim 1, wherein the radiation is x-rays.

6. The method of claim 1, wherein the radiation is far-ultraviolet.

7. The method of claim 1, wherein the radiation is ion beam.

8. The method of claim 1, wherein the sol solution is PZT solution.

9. The method of claim 1, wherein the step of exposing the thin film to the radiation additionally comprises:

selectively exposing and developing selected areas of the thin film prior to the step of baking the thin film.

10. The method of claim 1, wherein the energy of the radiation is from 1 $\mu C/cm^2$ to 4000 $\mu C/cm^2$.

11. The method of claim 10, wherein the energy of the radiation is from 3000 $\mu C/cm^2$ to 4000 $\mu C/cm^2$.

12. The method of claim 1, wherein the thin film is a ferroelectric material.

13. The method of claim 1, wherein the thin film includes Indium Tin Oxide.

14. A method for forming a thin film of a complex compound on an upper surface of a substrate for a semiconductor device, comprising:

coating a sol-gel solution on the substrate to form a thin film on the substrate;

exposing the surface of the thin film to radiation to promote hydrolysis polycondensation in the thin film; and baking the thin film exposed to radiation in order to drive off organic material in the thin film and form the thin film of the complex compound on the upper surface of the substrate;

wherein the sol-gel solution is coated on the substrate in a thickness sufficient to form, in a single process including the coating, exposing and baking steps, the thin film of the complex compound in a thickness greater than a maximum thickness in which a thin film of complex compound is formed without cracking by a single process including coating and baking steps without an intermediate irradiation step.

* * * * *